United States Patent
Ohara

(10) Patent No.: US 10,362,191 B2
(45) Date of Patent: Jul. 23, 2019

(54) PHOTOELECTRIC CONVERSION DEVICE AND IMAGE READING DEVICE

(71) Applicant: FUJI XEROX CO., LTD., Tokyo (JP)

(72) Inventor: Kensuke Ohara, Yokohama (JP)

(73) Assignee: FUJI XEROX CO., LTD., Tokyo (JP)

( * ) Notice: Subject to any disclaimer, the term of this patent is extended or adjusted under 35 U.S.C. 154(b) by 70 days.

(21) Appl. No.: 15/592,892

(22) Filed: May 11, 2017

(65) Prior Publication Data

US 2018/0063353 A1    Mar. 1, 2018

(30) Foreign Application Priority Data

Aug. 29, 2016  (JP) ................................. 2016-166515
Aug. 29, 2016  (JP) ................................. 2016-166516

(51) Int. Cl.
| | |
|---|---|
| *G06F 15/00* | (2006.01) |
| *H04N 1/00* | (2006.01) |
| *H04N 1/03* | (2006.01) |
| *H01L 27/148* | (2006.01) |
| *H04N 5/369* | (2011.01) |
| *H04N 9/04* | (2006.01) |

(52) U.S. Cl.
CPC ... *H04N 1/00981* (2013.01); *H01L 27/14806* (2013.01); *H04N 1/03* (2013.01); *H04N 5/3692* (2013.01); *H04N 9/045* (2013.01); *H04N 2201/0081* (2013.01)

(58) Field of Classification Search
CPC .... H04N 1/00981; H04N 1/03; H04N 5/3692; H04N 9/045; H01L 27/14806

USPC ......................................................... 358/483
See application file for complete search history.

(56) References Cited

U.S. PATENT DOCUMENTS

| | | | | |
|---|---|---|---|---|
| 6,842,585 B2* | 1/2005 | Matsuo | ..................... | G02B 7/28 257/712 |
| 2005/0258425 A1* | 11/2005 | Izumi | ................ | H01L 27/14665 257/72 |
| 2010/0220370 A1* | 9/2010 | Ueno | .................. | H04N 1/02815 358/475 |

(Continued)

FOREIGN PATENT DOCUMENTS

| | | |
|---|---|---|
| JP | 2001-298581 A | 10/2001 |
| JP | 2006-197012 A | 7/2006 |

(Continued)

*Primary Examiner* — Mark R Milia
(74) *Attorney, Agent, or Firm* — Oliff PLC

(57) ABSTRACT

Provided is a photoelectric conversion device including: a photoelectric conversion element row including photoelectric conversion elements arranged in one direction which faces from one end to the other end; a substrate to which the photoelectric conversion element row is attached; a processing circuit attached to the substrate on an outer side than the one end of the photoelectric conversion element row in the one direction and configured to perform a process on output signals output from photoelectric conversion elements disposed on the one end side in the photoelectric conversion element row; and another processing circuit attached to the substrate on an outer side than the other end of the photoelectric conversion element row in the one direction and configured to perform a process on another output signals output from photoelectric conversion elements disposed on the other end side in the photoelectric conversion element row.

8 Claims, 8 Drawing Sheets

(56) References Cited

U.S. PATENT DOCUMENTS

2015/0281485 A1* 10/2015 Kitamura ........... H04N 1/00557
358/474

FOREIGN PATENT DOCUMENTS

JP       2011-250347 A    12/2011
JP       2012-108424 A     6/2012

* cited by examiner

PHOTOELECTRIC CONVERSION DEVICE AND IMAGE READING DEVICE

CROSS-REFERENCE TO RELATED APPLICATION

This application is based on and claims priorities under 35 USC 119 from Japanese Patent Application No. 2016-166515 filed on Aug. 29, 2016 and Japanese Patent Application No. 2016-166516 filed on Aug. 29, 2016.

BACKGROUND

Technical Field

The present invention relates to a photoelectric conversion device and an image reading device.

Background Art

An image reading device is known that reads an image of a document by receiving reflected light from the document, which is irradiated with light, using a photoelectric conversion element row, which has a plurality of photoelectric conversion elements arranged along a main scan direction, and by causing a document reading location to sequentially move along a sub scan direction.

SUMMARY

Here, a photoelectric conversion element row and a processing circuit operate together in association with feeding electricity and generate heat in association with the operation. Therefore, in a case where the photoelectric conversion element row and the processing circuit are attached to the same substrate, there is a case where local temperature rise occurs in the substrate according to a locational relationship between the photoelectric conversion element row and the processing circuit.

An object of the present invention is to suppress the local temperature rise which occurs in the substrate.

According to an aspect of the invention, a photoelectric conversion device includes:
- a photoelectric conversion element row that includes a plurality of photoelectric conversion elements arranged in one direction which faces from one end to the other end;
- a substrate to which the photoelectric conversion element row is attached;
- a processing circuit that is attached to the substrate on an outer side than the one end of the photoelectric conversion element row in the one direction, and is configured to perform a process on output signals which are output from photoelectric conversion elements disposed on the one end side in the photoelectric conversion element row; and
- another processing circuit that is attached to the substrate on an outer side than the other end of the photoelectric conversion element row in the one direction, and is configured to perform a process on another output signals which are output from photoelectric conversion elements disposed on the other end side in the photoelectric conversion element row.

DESCRIPTION OF EMBODIMENTS

Hereinafter, embodiments of the present invention will be described with reference to the accompanying drawings.

[Configuration of Image Reading Device]

Figure 1:
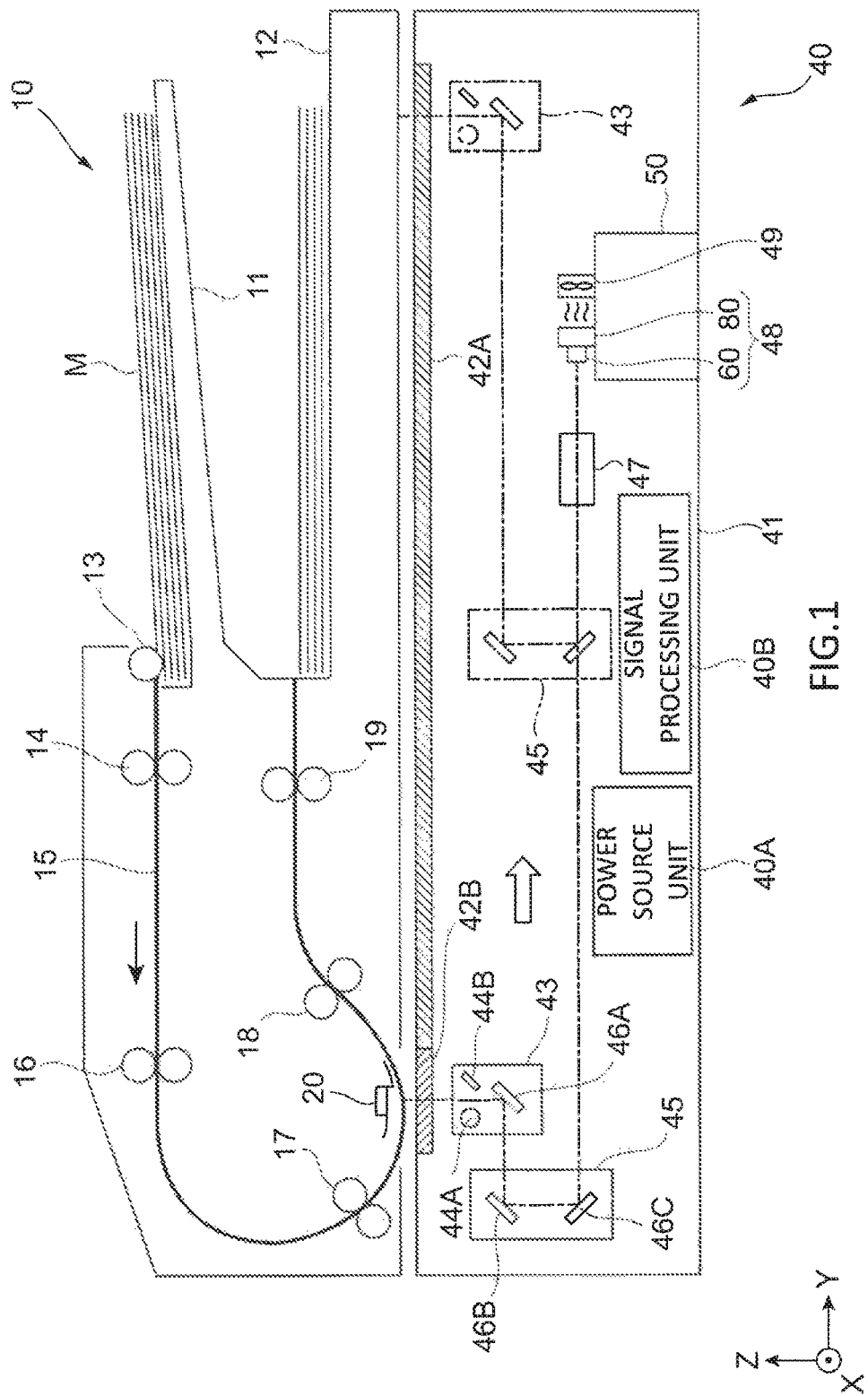
FIG. 1 is a view illustrating an example of a whole configuration of an image reading device to which an embodiment is applied.

FIG. 1 is a view illustrating an example of a whole configuration of an image reading device to which an embodiment is applied. The image reading device includes a document sending device 10 that sequentially transports a document M from a loaded document bundle, and a scan device 40 that scans and reads an image of the document M.

Hereinafter, in the image reading device illustrated in FIG. 1, a direction which faces a front side from a central side in the drawing is referred to as a depth direction X, a direction which faces a right side from a left side in the drawing is referred to as a width direction Y, and a direction which faces an upper side from a lower side in the drawing is referred to as a height direction Z. Furthermore, in an embodiment, as an example of one direction, the depth direction X corresponds to a main scan direction in an image reading operation, and the width direction Y corresponds to a sub scan direction in the image reading operation.

The document sending device 10 includes a document storage unit 11 that loads a document bundle which includes a plurality of pieces of documents M, and an ejected paper storage unit 12 that is provided on a lower side of the document storage unit 11 and loads the document M of which the reading ends. In addition, the document sending device 10 includes an extraction roller 13 that extracts and transports the document M in the document storage unit 11, and a separation mechanism 14 that is provided on a downstream side in a document transport direction of the extraction roller 13 and separates the documents M one by one. Furthermore, in the document sending device 10, a first transport roller 16, a second transport roller 17, a third transport roller 18, and a fourth transport roller 19 are sequentially provided on the transport path 15, through which the document M is transported, from an upstream side in the document transport direction. Here, the first transport roller 16 and the second transport roller 17 send the document M toward a reading location where the document M is read by the scan device 40. The third transport roller 18 further transports the document M, which is read by the scan device 40 while passing through the reading location, downstream. Furthermore, the fourth transport roller 19 further transports the document M, which is read, and discharges the document M to the ejected paper storage unit 12.

In addition, in the document sending device 10, a reflective plate 20, which extends in the depth direction X, is formed by a white plate member, and becomes a background of the document M that passes through the reading location, is provided in the reading location where the document M is read by the scan device 40. The reflective plate 20 is used as white reference for shading compensation.

In contrast, the scan device 40 supports the above-described document sending device 10 such that the document sending device 10 can be open and closed, and reads the document M which is transported by the document sending device 10. The scan device 40 includes a device frame 41, a first platen glass 42A, and a second platen glass 42B.

The device frame 41 supports the document sending device 10 such that the document sending device 10 can be open and closed, and forms a housing of the scan device 40. The first platen glass 42A is attached to an upper part side of the device frame 41, and the document M, which is a reading target, is disposed on the first platen glass 42A in a state in which the document M is stopped. The second platen glass 42B is provided on a lower side of the reflective plate 20 on the upper part side of the device frame 41, and the document M, which is transported by the document sending device 10 and is the reading target, passes through the upper part of the second platen glass 42B.

In addition, the scan device 40 includes a full rate carriage 43 that reads the image of the document M in such a way that the full rate carriage 43 stops under the second platen glass 42B or moves under the first platen glass 42A along the width direction Y, and a half rate carriage 45 that supplies light, which is acquired from the full rate carriage 43, to an image forming unit in such a way that the half rate carriage 45 stops or moves along the width direction Y. Here, the full rate carriage 43 includes a light source device 44A (white light source) that irradiates the document M with right, a light source mirror 44B that reflects light from the light source device 44A toward the document M, and a first mirror 46A that receives reflected light which is acquired from the document M. In contrast, the half rate carriage 45 includes a second mirror 46B and a third mirror 46C that reflect light, which is reflected from the first mirror 46A, toward an image forming lens 47.

Furthermore, in addition, the scan device 40 includes the image forming lens 47 and a light reception unit 48. Furthermore, the light reception unit 48, which is an example of a photoelectric conversion device, includes a Charge Coupled Device (CCD) unit 60 that is disposed on a side which faces the image forming lens 47, and a substrate unit 80 that is disposed on a rear surface side of the CCD unit 60 when viewed from the image forming lens 47, that maintains the CCD unit 60, and that is electrically coupled to the CCD unit 60.

Here, the image forming lens 47 optically reduces an optical image which is acquired from the third mirror 46C. In addition, the CCD unit 60, which is provided in the light reception unit 48, performs photoelectric conversion on the optical image which is formed by the image forming lens 47. That is, the scan device 40 causes the CCD unit 60 to form an image using a so-called optical reduction system. In addition, in the embodiment, as will be described later, a unit, in which red, green, and blue photoelectric conversion element rows respectively provided along the main scan direction are arranged and disposed in the sub scan direction, is used as the CCD unit 60. Therefore, the image, which is formed on the document M, is read as a full color image using the CCD unit 60. In addition, the substrate unit 80, which forms the light reception unit 48 together with the CCD unit 60, supplies power to and performs various controls on circuit elements or the like, which are provided in the CCD unit 60 and the substrate unit 80, and performs various image processes on image data of the document M which is supplied from the CCD unit 60.

In addition, the scan device 40 includes a ventilation fan 49 and a pedestal 50. Here, the ventilation fan 49 as an example of a ventilation device is disposed on a rear surface side (downstream side in the width direction Y) of the substrate unit 80 when viewed from the image forming lens 47, and sends air toward the substrate unit 80. In addition, the pedestal 50 as an example of a support member is fixed to a bottom inside the device frame 41. The light reception unit 48 is attached to the pedestal 50, and thus the pedestal 50 supports the light reception unit 48 in a state in which the light reception unit 48 is fixed. Furthermore, the pedestal 50 supports the image forming lens 47 and the ventilation fan 49 in a state in which the image forming lens 47 and the ventilation fan 49 are fixed.

Furthermore, the scan device 40 further includes a power source unit 40A that supplies power to respective units including the light reception unit 48, and a signal processing unit 40B that is configured to perform various processes on an image reading signal which is supplied from the light reception unit 48.

[Image Reading Operation]

Here, an operation of reading the image of the document M using the image reading device illustrated in FIG. 1 will be described.

(Fixed Reading Mode)

For example, in a fixed reading mode, in which the image of the document M placed on the first platen glass 42A is read, the full rate carriage 43 and the half rate carriage 45 move in an arrow direction (width direction Y) in a ratio of 2:1. Here, a reading surface of the document M is irradiated with light from the light source device 44A which is provided in the full rate carriage 43. Furthermore, reflected light from the document M is sequentially reflected in the first mirror 46A, the second mirror 46B, and the third mirror 46C, and is led to the image forming lens 47. Light which is led to the image forming lens 47 forms an image on a light reception surface of the CCD unit 60 which forms the light reception unit 48. The respective color photoelectric conversion element rows, which form the CCD unit 60, respectively include one-dimensional sensors, and simultaneously process one line of the document M. A subsequent one line of the document M is read by moving the full rate carriage 43 and the half rate carriage 45 in a direction (sub scan direction (width direction Y)) which intersects with a line direction (main scan direction (depth direction X)). In a case where the above process is performed over the whole document M, a document corresponding to one page is completely read.

(Transport Reading Mode)

In contrast, in a transport reading mode, in which the image of the document transported by the document sending device 10 is read, the document M which is transported in the sub scan direction passes above the second platen glass 42B. Here, the full rate carriage 43 and the half rate carriage 45 are placed in a state of being stopped in locations indicated by a solid line illustrated in FIG. 1. Furthermore, reflected light corresponding to a first line of the document M, which is being transported, passes through the first mirror 46A, the second mirror 46B, and the third mirror 46C, and an image is formed by the image forming lens 47. Thereafter, the image is read by the CCD unit 60. That is, after one line in the main scan direction is simultaneously processed by the CCD unit 60, a subsequent one line of the document M, which is transported by the document sending device 10, in the main scan direction is read. Furthermore, in a case where, after a front tip of the document M reaches the reading location of the second platen glass 42B, and a rear tip of the document M passes through the reading location above the second platen glass 42B, every one line of the document M is sequentially read in the main scan direction, and thus the document corresponding to one page is completely read over the sub scan direction.

[Configuration of Light Reception Unit]

Subsequently, a configuration of the above-described light reception unit 48 will be described in more detail.

Figure 2:
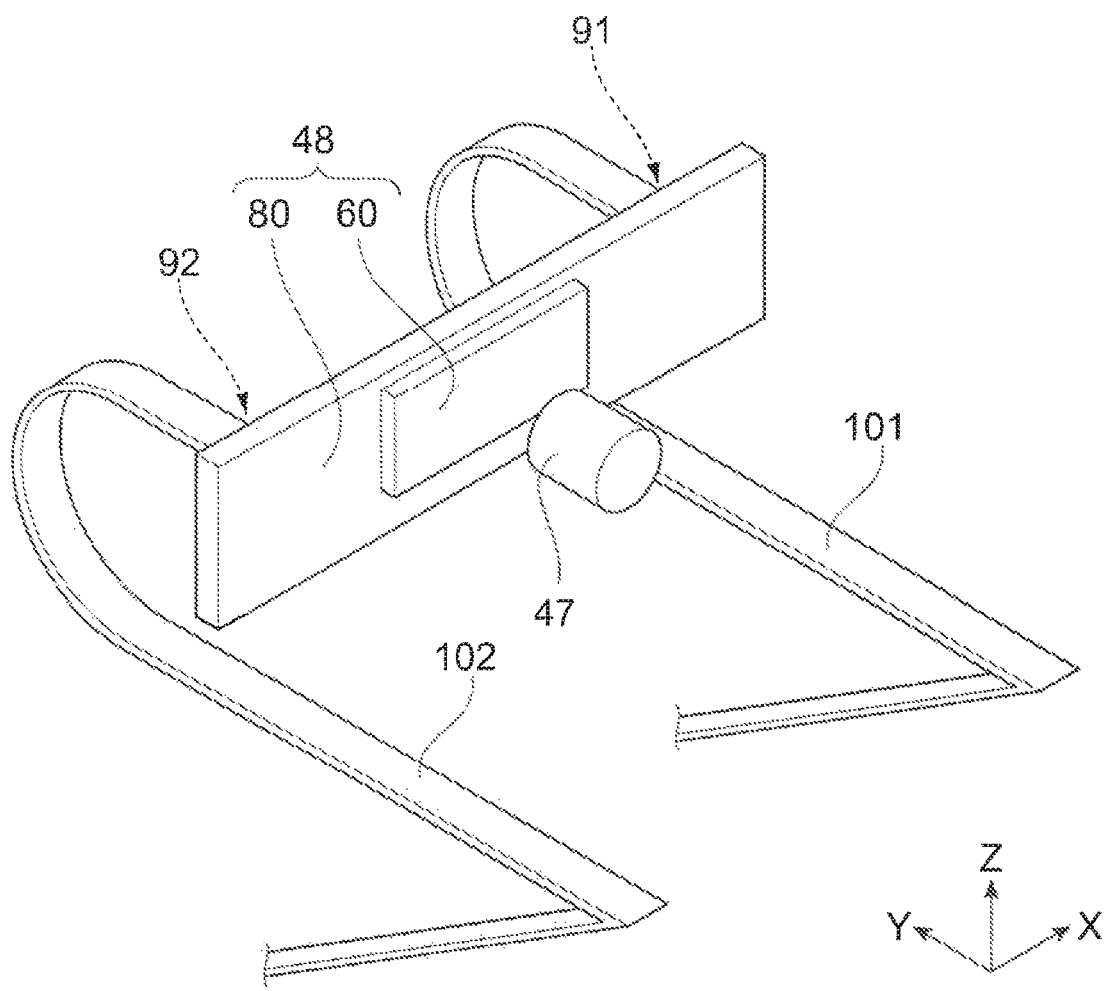
FIG. 2 is a perspective view illustrating a light reception unit viewed from an upstream side in a depth direction and an upstream side in a width direction.

FIG. 2 is a perspective view illustrating the light reception unit 48 which is viewed from an upstream side in the depth direction X and an upstream side in the width direction Y. Meanwhile, FIG. 2 illustrates the image forming lens 47 illustrated in FIG. 1, a power cable 101, and a signal cable 102, which will be described later, together with the light reception unit 48.

Hereinafter, in the light reception unit 48, a side (the upstream side in the width direction Y) on which the CCD unit 60 is attached to the substrate unit 80 is referred to as a front surface, and a side (the downstream side in the width direction Y) on which the CCD unit 60 is not attached to the substrate unit 80 is referred to as a rear surface. Therefore, FIG. 2 illustrates the light reception unit 48 which is viewed from the front surface side.

Figure 3:
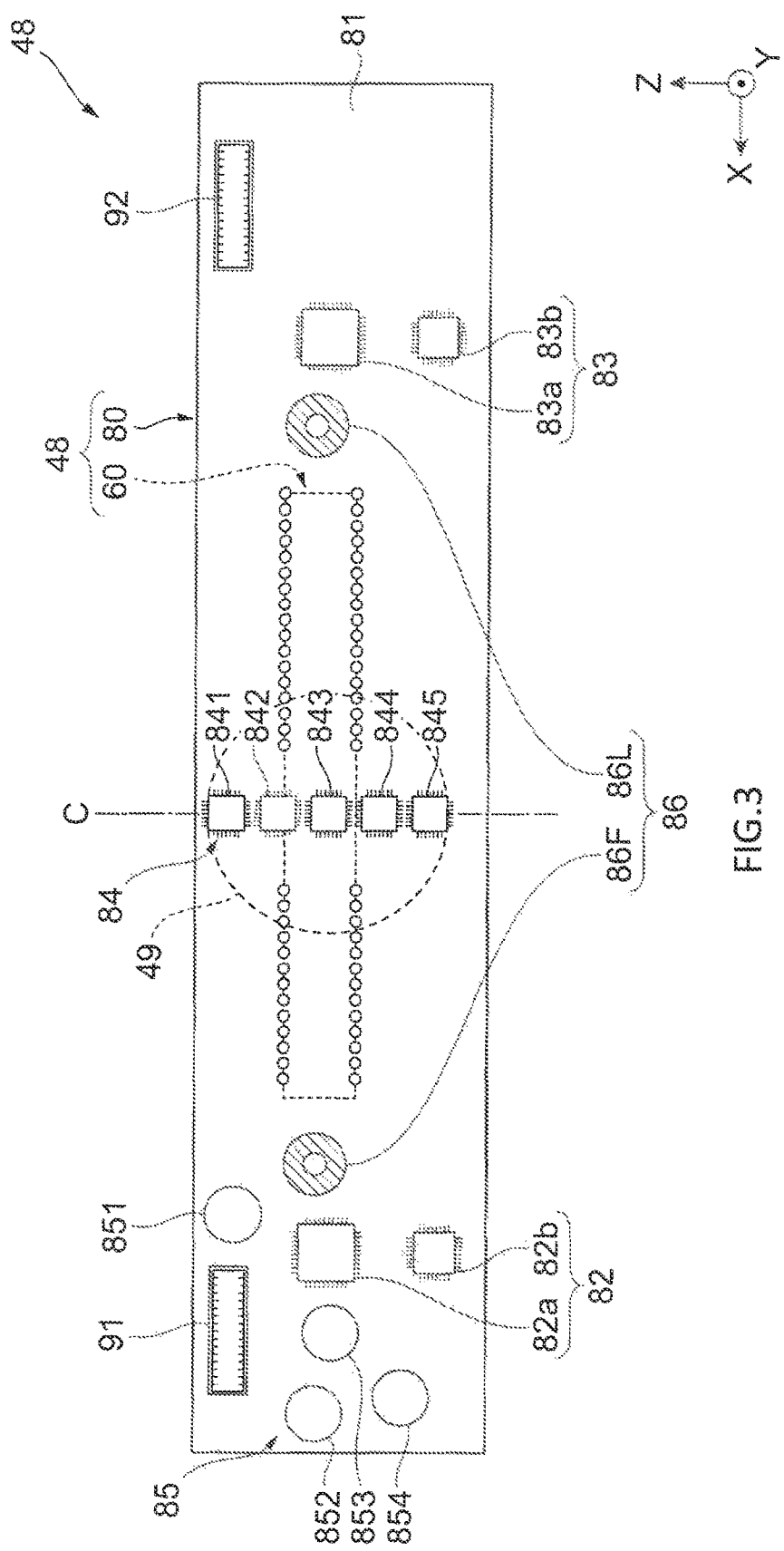
FIG. 3 is a rear view illustrating the light reception unit viewed from the downstream side in the width direction.

In addition, FIG. 3 is a rear view illustrating the light reception unit 48 which is viewed from the downstream side in the width direction Y. Meanwhile, FIG. 3 illustrates the ventilation fan 49, which is illustrated in FIG. 1, using a dotted line together with the light reception unit 48. However, the power cable 101 and the signal cable 102, which are illustrated in FIG. 2, are not illustrated in FIG. 3.

The CCD unit 60, which forms the light reception unit 48, is a plate-shaped member which has a front surface side (rear surface side) that is formed in a rectangular shape. In the CCD unit 60, a length in the depth direction X is larger than a length in the height direction Z. In addition, in the CCD unit 60, the length in the height direction Z is larger than a length in the width direction Y. Furthermore, in a state in which three photoelectric conversion element rows (not illustrated in the drawing) of the CCD unit 60 are exposed on the front surface side, the rear surface side of the CCD unit 60 is attached to the front surface side of the substrate unit 80. Here, the image forming lens 47 is disposed to face the front surface side of the CCD unit 60. Meanwhile, the CCD unit 60 will be described in detail later.

In addition, the substrate unit 80 which forms the light reception unit 48 is a plate-shaped member which has a front surface side (rear surface side) that is formed in a rectangular shape. In the substrate unit 80, a length in the depth direction X is larger than a length in the height direction Z. In addition, in the substrate unit 80, the length in the height direction Z is larger than a length in the width direction Y. Here, the length of the substrate unit 80 in the depth direction X is larger than the length of the CCD unit 60 in the depth direction X. In addition, the length of the substrate unit 80 in the width direction Y is larger than the length of the CCD unit 60 in the width direction Y.

Furthermore, the substrate unit 80 maintains the CCD unit 60 on the front surface side of the substrate unit 80 such that both ends of the CCD unit 60 in the depth direction X are located on an inner side than both ends of the substrate unit 80 in the depth direction X and both ends of the CCD unit 60 in the width direction Y are located on an inner side than both ends of the substrate unit 80 in the width direction Y. Meanwhile, in the example, the location of the CCD unit 60 for the substrate unit 80 is determined (attached) such that a center of the CCD unit 60 in the depth direction X overlaps a center of the substrate unit 80 in the depth direction X on a common central line C.

In addition, the substrate unit 80 includes a wiring substrate 81, a first-half processing unit 82, a last-half processing unit 83, a clock buffer circuit group 84, an aluminum electrolytic capacitor group 85, a frame ground 86, a power source connector 91, and a signal connector 92. Here, all the first-half processing unit 82, the last-half processing unit 83, the clock buffer circuit group 84, the aluminum electrolytic capacitor group 85, the frame ground 86, the power source connector 91, and the signal connector 92 are attached to the rear surface side of the wiring substrate 81.

The wiring substrate 81 as an example of a substrate is formed by a print substrate which is acquired by forming a conductive pattern on an insulation substrate. The wiring substrate 81 of the embodiment is formed of, for example, a glass epoxy substrate which is one type of a rigid substrate and a multi-layer substrate which has a six-layer wiring pattern formed of copper. In addition, the CCD unit 60 is electrically coupled to and mechanically fixed to the wiring substrate 81 through soldering.

The first-half processing unit 82 performs a predetermined process on first half (which will be described in detail later) reading signals corresponding to the downstream side in the depth direction X in reading signals which are output by the CCD unit 60. Furthermore, the first-half processing unit 82 of the embodiment includes a first first-half processing circuit 82a which performs a first process on first-half reading signals that are input from the CCD unit 60, and a second first-half processing circuit 82b which performs a second process on the first-half reading signals on which the first process is completed and which are input from the first first-half processing circuit 82a.

The last-half processing unit 83 performs a predetermined process on last-half (which will be described in detail later) reading signals corresponding to the upstream side in the depth direction X in the reading signals which are output by the CCD unit 60. Furthermore, the last-half processing unit 83 of the embodiment includes a first last-half processing circuit 83a which performs a first process on the last-half reading signals that are input from the CCD unit 60, and a second last-half processing circuit 83b which performs a second process on the last-half reading signals on which the first process is completed and which are input from the first last-half processing circuit 83a.

Meanwhile, in the embodiment, the first-half reading signals correspond to output signals, and the last-half reading signals correspond to another output signals, respectively.

Here, the first first-half processing circuit 82a and the first last-half processing circuit 83a are formed of a common-type integrated circuit (IC). Furthermore, each of the first first-half processing circuit 82a and the first last-half processing circuit 83a includes an amplifying circuit which amplifies the reading signal (analog signal) that is input from the CCD unit 60 as the first process, a filter circuit which removes noise from the reading signal acquired after the amplification, an A/D conversion circuit which performs analog/digital conversion on the reading signal acquired after the noise removal, an LVDS circuit which converts the reading signal acquired after the analog/digital conversion into a reading signal based on Low Voltage Differential Signaling (LVDS). In the embodiment, although the first first-half processing circuit 82a controls the clock buffer circuit group 84 as will be described later, the control function is included in the first last-half processing circuit 83a. Meanwhile, there is a case where the first first-half processing circuit 82a and the first last-half processing circuit 83a are called Analog Front End (AFE).

In addition, the second first-half processing circuit 82b and the second last-half processing circuit 83b are also formed of a common-type integrated circuit. Furthermore, each of the second first-half processing circuit 82b and the second last-half processing circuit 83b converts the reading signal (a digital signal based on the LVDS), on which the first process is completed and which is input from the first first-half processing circuit 82a or the first last-half processing circuit 83a, into a reading signal based on V-by-One as the second process. Meanwhile, in the V-by-One, the reading signal is output as a serial-type high-speed transmission signal.

Subsequently, attachment locations of the first-half processing unit 82 and the last-half processing unit 83 in the light reception unit 48 will be described.

First, the first-half processing unit 82 is attached to the rear surface side of the wiring substrate 81 on the downstream side in the depth direction X rather than a downstream-side end (first-half side end) of the CCD unit 60, which is attached to the front surface side of the wiring substrate 81, in the depth direction X. In addition, the last-half processing unit 83 is attached to the rear surface side of the wiring substrate 81 on the upstream side in the depth direction X rather than an upstream-side end (last-half side end) of the CCD unit 60, which is attached to the front surface side of the wiring substrate 81, in the depth direction X. In the light reception unit 48 of the embodiment, the CCD unit 60 is located between the first-half processing unit 82 and the last-half processing unit 83 in the depth direction X when viewed from the wiring substrate 81.

Furthermore, in the embodiment, the first first-half processing circuit 82a as an example of a processing circuit, the first last-half processing circuit 83a as an example of another processing circuit, and the CCD unit 60 are arranged and disposed on a straight line along the depth direction X. That is, in the embodiment, the CCD unit 60 is interposed between the first first-half processing circuit 82a and the first last-half processing circuit 83a. In addition, in the first-half processing unit 82, the second first-half processing circuit 82b is disposed on the upstream side in the height direction Z rather than the first first-half processing circuit 82a. That is, in the embodiment, the first first-half processing circuit 82a and the second first-half processing circuit 82b are arranged and disposed on a straight line along the height direction Z. In contrast, in the last-half processing unit 83, the second last-half processing circuit 83b is also disposed on the upstream side in the height direction Z rather than the first last-half processing circuit 83a. That is, in the embodiment, the first last-half processing circuit 83a and the second last-half processing circuit 83b are arranged and disposed on a straight line along the height direction Z.

The clock buffer circuit group 84 as an example of an output circuit generates and outputs a clock signal, which is reference of the operation, to the CCD unit 60 under the control of the first first-half processing circuit 82a. Furthermore, the clock buffer circuit group 84 includes a first clock buffer circuit 841, a second clock buffer circuit 842, a third clock buffer circuit 843, a fourth clock buffer circuit 844, and a fifth clock buffer circuit 845. The first to fifth clock buffer circuits 841 to 845 are formed of a common-type integrated circuit.

Subsequently, an attachment location of the clock buffer circuit group 84 in the light reception unit 48 will be described.

The first to fifth clock buffer circuits 841 to 845, which form the clock buffer circuit group 84, are attached to the rear surface side of the wiring substrate 81 on an inner side than the downstream-side end (first-half side end) and the upstream-side end (last-half side end) of the CCD unit 60, which is attached to the front surface side of the wiring substrate 81, in the depth direction X. Furthermore, in the embodiment, the five first to fifth clock buffer circuits 841 to 845 are arranged and disposed on the central line C along the height direction Z. In the light reception unit 48 of the embodiment, the CCD unit 60 which extends in the depth direction X and the clock buffer circuit group 84 which extends in the height direction Z are arranged to form a cross shape when viewed from the wiring substrate 81.

Furthermore, in the embodiment, the ventilation fan 49 is attached to a location which faces the clock buffer circuit group 84 that is provided in the light reception unit 48. In addition, when viewed from another point of view, it is conceivable that the ventilation fan 49 is attached to a location which faces a region where the CCD unit 60 and the clock buffer circuit group 84 intersect with each other.

The aluminum electrolytic capacitor group 85 performs a smoothing process of reducing ripples of a direct current supplied from the power source connector 91, and supplies the direct current, on which the smoothing process is performed, to the respective units which form the light reception unit 48. Furthermore, the aluminum electrolytic capacitor group 85 includes a first aluminum electrolytic capacitor 851, a second aluminum electrolytic capacitor 852, a third aluminum electrolytic capacitor 853, and a fourth aluminum electrolytic capacitor 854.

Subsequently, an attachment location of the aluminum electrolytic capacitor group 85 in the light reception unit 48 will be described.

The first to fourth aluminum electrolytic capacitors 851 to 854, which form the aluminum electrolytic capacitor group 85, are collectively attached to the rear surface side of the wiring substrate 81 on the downstream side in the depth direction X rather than the downstream-side end (first-half side end) of the CCD unit 60, which is attached to the front surface side of the wiring substrate 81, in the depth direction X. That is, the aluminum electrolytic capacitor group 85 is attached to the wiring substrate 81 on the downstream side in the depth direction X, that is, a side to which the power source connector 91, which will be described, is attached. When viewed from another point of view, the aluminum electrolytic capacitor group 85 is not attached to the wiring substrate 81 on the upstream side in the depth direction X, that is, a side to which the signal connector 92, which will be described later, is attached.

The frame ground 86 causes a wiring pattern (ground plane) of a certain layer to be exposed in a peripheral edge of an opening provided in the wiring substrate 81, and is used to ground or cool the respective units which form the light reception unit 48. Furthermore, the frame ground 86 includes a first-half side frame ground 86F which is provided in the wiring substrate 81 on the downstream side (first-half side) in the depth direction X, and a last-half side frame ground 86L which is provided in the wiring substrate 81 on the upstream side (last-half side) in the depth direction X.

Subsequently, an attachment location of the frame ground 86 in the light reception unit 48 will be described.

First, the first-half side frame ground 86F as an example of a through hole is attached to the rear surface side of the wiring substrate 81 on the downstream side in the depth direction X rather than the downstream-side end (first-half side end) of the CCD unit 60, which is attached to the front surface side of the wiring substrate 81, in the depth direction X. In addition, the first-half side frame ground 86F is attached to the rear surface side of the wiring substrate 81 on the upstream side in the depth direction X rather than the first first-half processing circuit 82a which is attached to the rear surface side of the wiring substrate 81. In the light reception unit 48 of the embodiment, the first-half side frame ground 86F is located between the CCD unit 60 and the first first-half processing circuit 82a in the depth direction X when viewed from the wiring substrate 81.

In addition, the last-half side frame ground 86L as an example of another through hole is attached to the rear surface side of the wiring substrate 81 on the upstream side in the depth direction X rather than the upstream-side end (last-half side end) of the CCD unit 60, which is attached to the front surface side of the wiring substrate 81, in the depth direction X. In addition, the last-half side frame ground 86L is attached to the rear surface side of the wiring substrate 81 on the downstream side in the depth direction X rather than the first last-half processing circuit 83a which is attached to the rear surface side of the wiring substrate 81. In the light reception unit 48 of the embodiment, the last-half side frame ground 86L is located between the CCD unit 60 and the first last-half processing circuit 83a in the depth direction X when viewed from the wiring substrate 81.

Furthermore, in the embodiment, in a case where the light reception unit 48 is attached and fixed to the pedestal 50 (refer to FIG. 1), the frame ground 86, which is provided in the wiring substrate 81, is used. That is, the opening (not illustrated in the drawing), which is provided in a metal plate of the pedestal 50, is coupled and fixed to the frame ground 86, which is provided in the wiring substrate 81, using a screw of the like. Meanwhile, the pedestal 50, which includes the metal plate, is formed of a metallic material such as stainless.

The power source connector 91 is coupled to the power source unit 40A (refer to FIG. 1), which is provided in the scan device 40, through the power cable 101, and supplies a direct current, which is supplied from the power source unit 40A through the power cable 101, to the aluminum electrolytic capacitor group 85. Here, in the power source connector 91 of the embodiment, a plurality of direct currents, which have different voltage magnitudes, are supplied from the power source unit 40A. Meanwhile, the power cable 101 as an example of a power source line is detachable from the power source connector 91.

Subsequently, an attachment location of the power source connector 91 in the light reception unit 48 will be described.

The power source connector 91 is attached to the rear surface side of the wiring substrate 81 on the downstream side in the depth direction X and the downstream side in the height direction Z rather than the downstream-side end (first-half side end) of the CCD unit 60, which is attached to the front surface side of the wiring substrate 81, in the depth direction X.

In the light reception unit 48 of the embodiment, the power source connector 91 is disposed in the depth direction X on a side where the aluminum electrolytic capacitor group 85 is disposed.

The signal connector 92 is coupled to the signal processing unit 40B (refer to FIG. 1) which is provided in the scan device 40 through the signal cable 102, and supplies a serial-type high-speed transmission signal (V-by-One), which is supplied from the second first-half processing circuit 82b and the second last-half processing circuit 83b, to the signal processing unit 40B through the signal cable 102. Meanwhile, the signal cable 102 as an example of a signal line is detachable from the signal connector 92.

Subsequently, an attachment location of the signal connector 92 in the light reception unit 48 will be described.

The signal connector 92 is attached to the rear surface side of the wiring substrate 81 on the upstream side in the depth direction X and the downstream side in the height direction Z rather than on the upstream-side end (last-half side end) of the CCD unit 60, which is attached to the front surface side of the wiring substrate 81, in the depth direction X. In the light reception unit 48 of the embodiment, the signal connector 92 is disposed in the depth direction X on a side where the aluminum electrolytic capacitor group 85 is not disposed.

[Configuration of CCD Unit]

Figure 4:
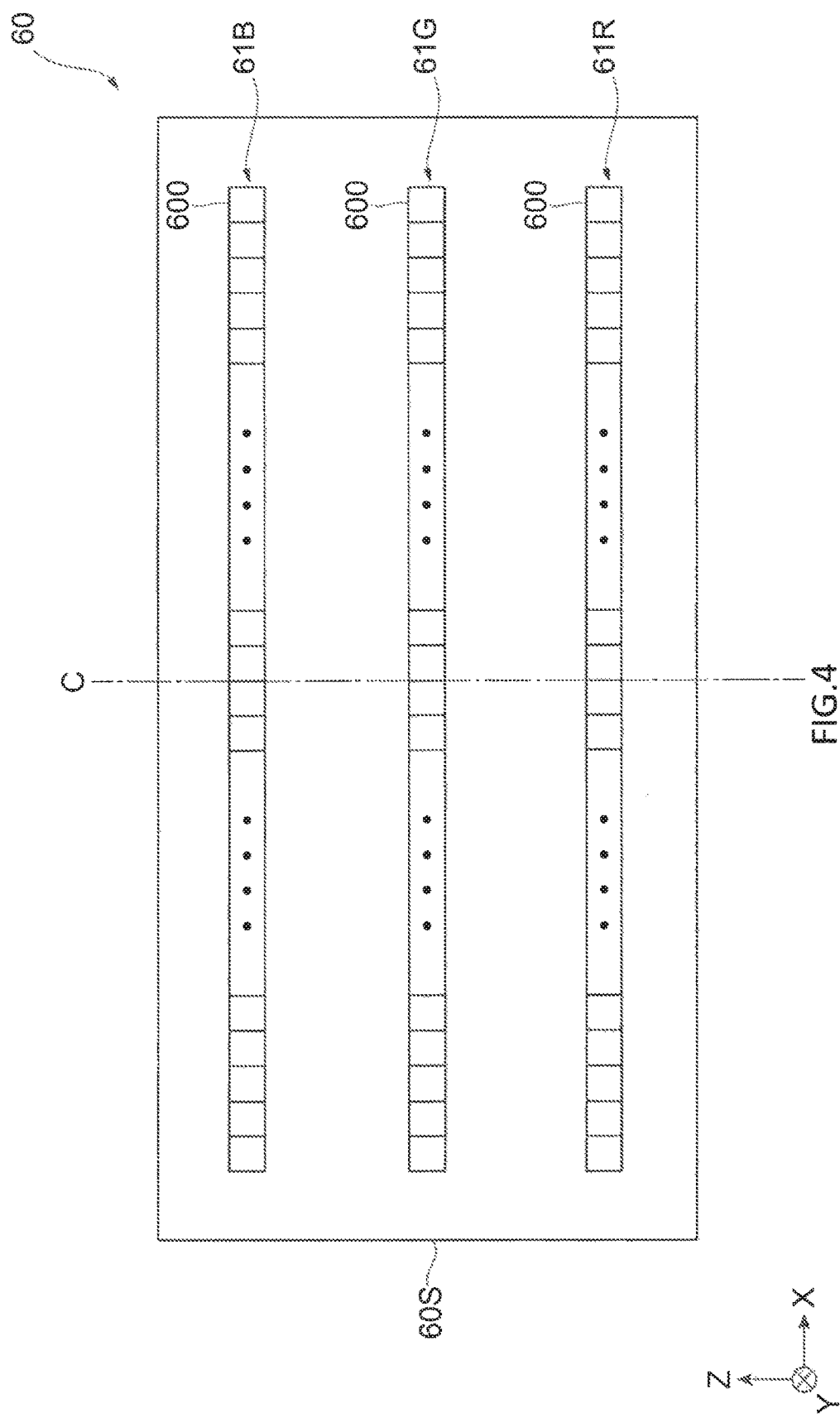
FIG. 4 is a front view illustrating a CCD unit which is viewed from an upstream side in the width direction.

FIG. 4 is a front view illustrating the CCD unit 60 which is viewed from the upstream side in the width direction Y.

The CCD unit 60 includes a CCD substrate 60S which has a rectangular shape, and three photoelectric conversion element rows 61R, 61G, and 61B which are arranged on and attached to a front surface side of the CCD substrate 60S. Each of the three photoelectric conversion element rows 61R, 61G, and 61B includes a CCD image sensor, and is arranged and disposed in the height direction Z.

First, a filter, which selectively causes red light to pass, is attached to the photoelectric conversion element row 61R which is located on the lowermost side in the height direction Z (corresponding to the most upstream side in the sub scan direction). Hereinafter, the photoelectric conversion element row 61R, which functions as a red light detection image sensor, is referred to as a red photoelectric conversion element row 61R.

Subsequently, a filter, which selectively causes green light to pass, is attached to the photoelectric conversion element row 61G which is located on the upper side in the height direction Z (corresponding to the downstream side in the sub scan direction) than the red photoelectric conversion element row 61R. Hereinafter, the photoelectric conversion element row 61G, which functions as a green light detection image sensor, is referred to as a green photoelectric conversion element row 61G.

Subsequently, a filter, which selectively causes blue light to pass, is attached to the photoelectric conversion element row 61B which is located on the upper side in the height direction Z (corresponding to the downstream side in the sub scan direction) than the green photoelectric conversion element row 61G. Hereinafter, the photoelectric conversion element row 61B, which functions as a blue light detection image sensor, is referred to as a blue photoelectric conversion element row 61B.

Here, the red photoelectric conversion element row 61R, the green photoelectric conversion element row 61G, and the blue photoelectric conversion element row 61B are provided along the depth direction X (main scan direction), respectively. Therefore, the red photoelectric conversion element row 61R, the green photoelectric conversion element row 61G, and the blue photoelectric conversion element row 61B are in a locational relationship which is mutually parallel to each other.

In the embodiment, the red photoelectric conversion element row 61R, the green photoelectric conversion element row 61G, and the blue photoelectric conversion element row 61B are respectively formed by arranging, for example, a plurality of (in the example, 7500) photoelectric conversion elements (photodiodes) 600 having a square shape along the depth direction X. Furthermore, in the embodiment, in each of the red photoelectric conversion element row 61R, the green photoelectric conversion element row 61G, and the blue photoelectric conversion element row 61B, the central line C passes between a 3750-th photoelectric conversion element 600 and a 3751-th photoelectric conversion element 600 which are the center in the depth direction X.

In the description below, in the 7500 photoelectric conversion elements 600 which form each of the red photoelectric conversion element row 61R, the green photoelectric conversion element row 61G, and the blue photoelectric conversion element row 61B, first to 3500-th photoelectric conversion elements, which are located on the downstream side rather than the central line C in the depth direction X, are referred to as the "first half", and 3501-th to 7500-th photoelectric conversion elements, which are located on the upstream side rather than the central line C in the depth direction X, are referred to as the "last half". Furthermore, in the embodiment, the first photoelectric conversion element 600, which is located on the most downstream side in the depth direction X, corresponds to "one end", and the 7500-th photoelectric conversion element 600, which is located on the most upstream side in the depth direction X, corresponds to "the other end", respectively.

[Inner Configuration of CCD Unit]

Figure 5:
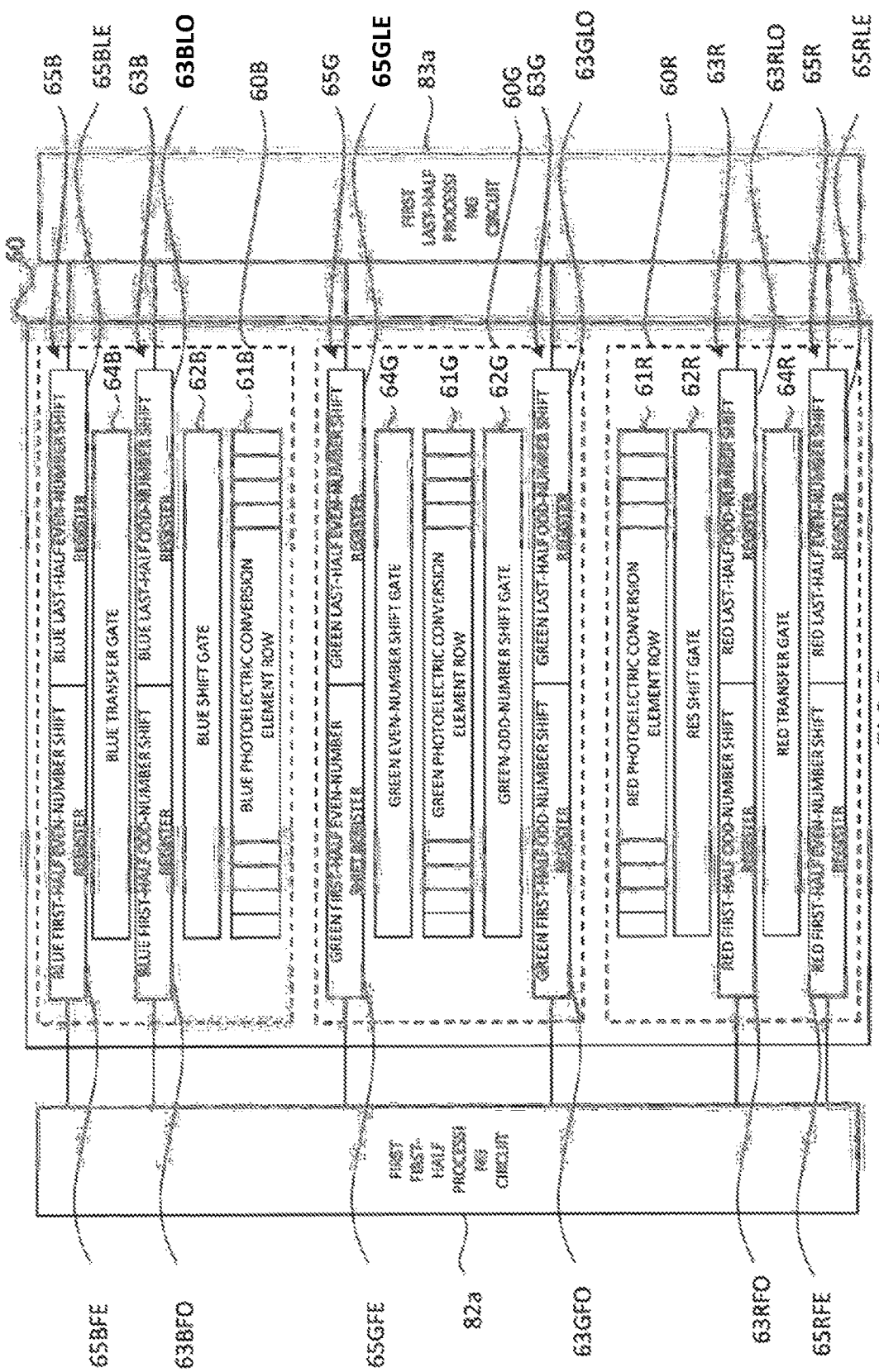
FIG. 5 is a view illustrating an inner configuration of the CCD unit.

FIG. 5 is a view illustrating an inner configuration of the CCD unit 60. Meanwhile, FIG. 5 illustrates the first first-half processing circuit 82a and the first last-half processing circuit 83a, which are illustrated in FIG. 3, together with the CCD unit 60.

In the embodiment, in order to realize a high-speed image process in the light reception unit 48 in the image reading operation, the reading signals (analog signals) of the red photoelectric conversion element row 61R (7500 photoelectric conversion elements 600) are divided into the first-half (first to 3500-th) signals and the last-half (3501 to 7500-th) signals, are divided into odd-numbered (first, third, ... , 7499-th) signals and even-numbered (second, fourth, ... , 7500-th) signals, and then resulting signals are outputs. Therefore, the reading signals are output from the red photoelectric conversion element row 61R by four systems, that is, first-half and odd-numbered elements (referred to as first-half odd-numbered elements), first-half and even-numbered elements (referred to as first-half even-numbered elements), last-half and odd-numbered elements (referred to as last-half odd-numbered elements), and last-half and even-numbered elements (referred to as last-half even-numbered elements). Meanwhile, the above-description is the same as in the green photoelectric conversion element row 61G and the blue photoelectric conversion element row 61B.

The CCD unit 60 includes a red detection unit 60R which is used to detect a red image, a green detection unit 60G which is used to detect a green image, and a blue detection unit 60B which is used to detect a blue image.

(Blue Detection Unit)

The blue detection unit 60B includes the above-described blue photoelectric conversion element row 61B, a blue shift gate 62B, a blue odd-number shift register 63B, a blue transfer gate 64B, and a blue even-number shift register 65B.

The blue shift gate 62B is coupled to the blue photoelectric conversion element row 61B. Furthermore, the blue shift gate 62B is provided to correspond to the whole 7500 blue photoelectric conversion elements 600.

The blue odd-number shift register 63B is coupled to the blue shift gate 62B. Furthermore, the blue odd-number shift register 63B sequentially transmits outputs of odd-numbered photoelectric conversion elements 600 (3750 elements) in outputs from the 7500 blue photoelectric conversion elements 600 inside, sorts the outputs for the first first-half processing circuit 82a and the first last-half processing circuit 83a, and outputs the resulting outputs. More specifically, the blue odd-number shift register 63B includes a blue first-half odd-number shift register 63BFO and a blue last-half odd-number shift register 63BLO. Furthermore, the blue first-half odd-number shift register 63BFO transmits outputs of the blue first-half odd-numbered photoelectric conversion elements 600 (1750 elements) to the first first-half processing circuit 82a, and the blue last-half odd-number shift register 63BLO transmits outputs of the blue last-half odd-numbered photoelectric conversion elements 600 (1750 elements) to the first last-half processing circuit 83a.

The blue transfer gate 64B is coupled to the blue odd-number shift register 63B. Furthermore, the blue transfer gate 64B is provided to correspond to blue even-numbered photoelectric conversion elements 600 (3750 elements), which are not output to the outside from the blue odd-number shift register 63B, in outputs of the blue shift gate 62B.

The blue even-number shift register 65B is coupled to the blue transfer gate 64B. Furthermore, the blue even-number shift register 65B sequentially transmits outputs of the blue even-numbered photoelectric conversion elements 600 (3750 elements) inside, sorts the outputs for the first first-half processing circuit 82a and the first last-half processing circuit 83a, and outputs the resulting outputs. More specifically, the blue even-number shift register 65B includes a blue first-half even-number shift register 65BFE and a blue last-half even-number shift register 65BLE. Furthermore, the blue first-half even-number shift register 65BFE transmits the outputs of the blue first-half even-numbered photoelectric conversion elements 600 (1750 elements) to the first first-half processing circuit 82a, and the blue last-half even-number shift register 65BLE transmits the outputs of the blue last-half even-numbered photoelectric conversion elements 600 (1750 elements) to the first last-half processing circuit 83a.

(Red Detection Unit)

The red detection unit 60R includes the above-described red photoelectric conversion element row 61R, a red shift gate 62R, a red odd-number shift register 63R, a red transfer gate 64R, and a red even-number shift register 65R. In addition, the red odd-number shift register 63R includes a red first-half odd-number shift register 63RFO and a red last-half odd-number shift register 63RLO. Furthermore, the red even-number shift register 65R includes a red first-half even-number shift register 65RFE and a red last-half even-number shift register 65RLE.

Since a configuration of the red detection unit 60R is the same as the above-described configuration of the blue detection unit 60B, the detailed description thereof will not be described here. That is, the red shift gate 62R corresponds to the blue shift gate 62B, the red odd-number shift register 63R corresponds to the blue odd-number shift register 63B, the red transfer gate 64R corresponds to the blue transfer gate 64B, and the red even-number shift register 65R corresponds to the blue even-number shift register 65B, respectively.

(Green Detection Unit)

The green detection unit 60G includes the above-described green photoelectric conversion element row 61G, a green odd-number shift gate 62G, a green odd-number shift register 63G, a green even-number shift gate 64G, and a green even-number shift register 65G.

The odd-number shift gate 62G is coupled to the green photoelectric conversion element row 61G. Furthermore, the green odd-number shift gate 62G is provided to correspond to odd-numbered photoelectric conversion elements 600 (3750 elements) in 7500 green photoelectric conversion elements 600.

The green odd-number shift register 63G is coupled to the green odd-number shift gate 62G. Furthermore, the green odd-number shift register 63G sequentially transmits outputs of the green odd-numbered photoelectric conversion elements 600 (3750 elements) inside, sorts the outputs for the first first-half processing circuit 82a and the first last-half processing circuit 83a, and outputs the resulting outputs. More specifically, the green odd-number shift register 63G includes a green first-half odd-number shift register 63GFO and a green last-half odd-number shift register 63GLO. Furthermore, the green first-half odd-number shift register 63GFO transmits outputs of the green first-half odd-numbered photoelectric conversion elements 600 (1750 elements) to the first first-half processing circuit 82a, and the green last-half odd-number shift register 63GLO transmits outputs of the green last-half odd-numbered photoelectric conversion elements 600 (1750 elements) to the first last-half processing circuit 83a.

The green even-number shift gate 64G is coupled to the green photoelectric conversion element row 61G. Furthermore, the green even-number shift gate 64G is provided to correspond to the even-numbered photoelectric conversion elements 600 (3750 elements) in the 7500 green photoelectric conversion elements 600.

The green even-number shift register 65G is coupled to the green even-number shift gate 64G. Furthermore, the green even-number shift register 65G sequentially transmits outputs of the green even-numbered photoelectric conversion elements 600 (3750 elements) inside, sorts the outputs for the first first-half processing circuit 82a and the first last-half processing circuit 83a, and outputs the resulting outputs. More specifically, the green even-number shift register 65G includes a green first-half even-number shift register 65GFE and a green last-half even-number shift register 65GLE. Furthermore, the green first-half even-number shift register 65GFE transmits the outputs of the green first-half even-numbered photoelectric conversion elements 600 (1750 elements) to the first first-half processing circuit 82a, and the green last-half even-number shift register 65GLE transmits outputs of the green last-half even-numbered photoelectric conversion elements 600 (1750 elements) to the first last-half processing circuit 83a.

[Power Source System in Light Reception Unit]

Figure 6:
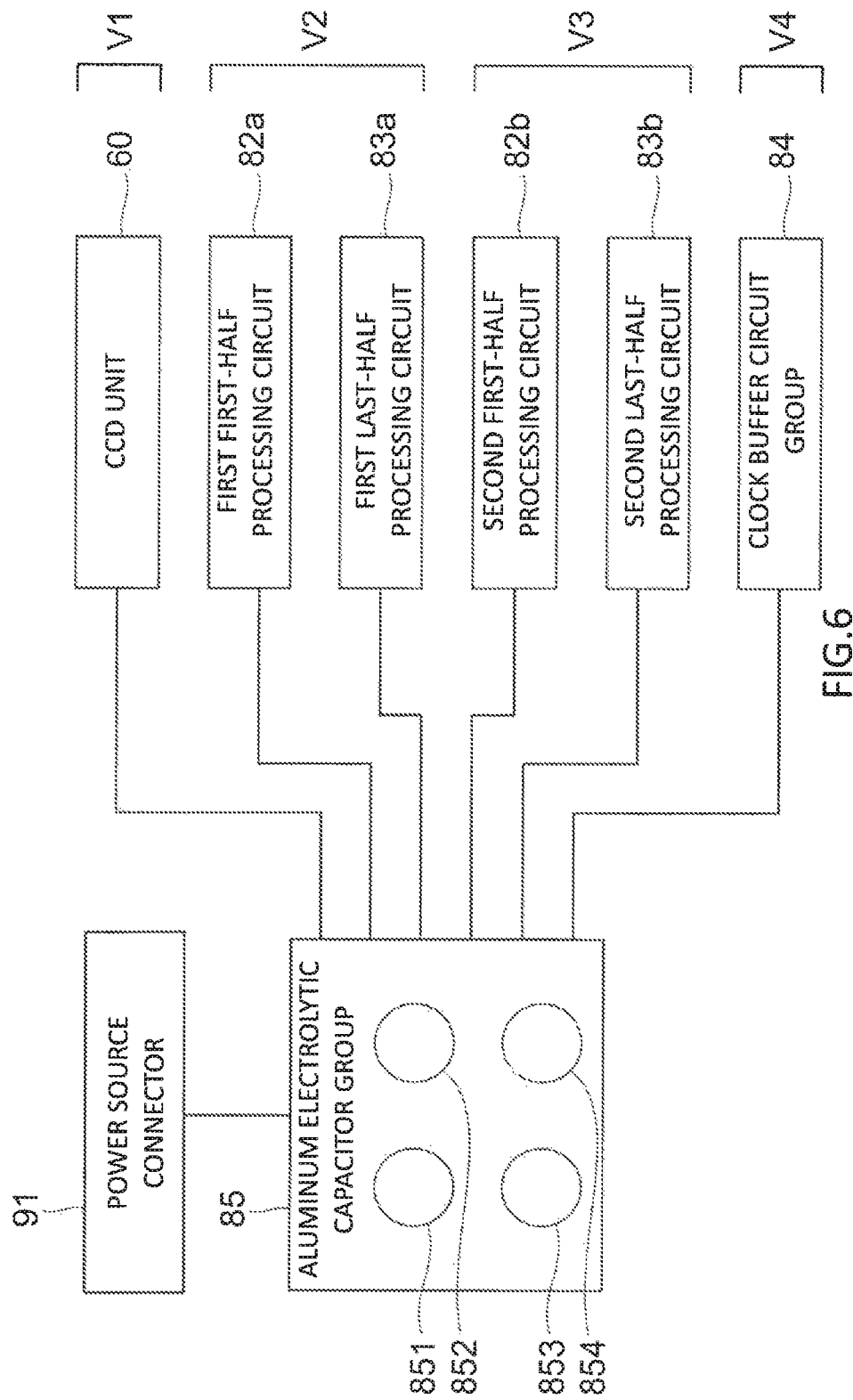
FIG. 6 is a view illustrating a power source system in a light reception unit.

FIG. 6 is a view illustrating a power source system in the light reception unit 48.

A direct current, which is supplied from the power cable 101 (see FIG. 2) through the power source connector 91, is supplied to the CCD unit 60, the first first-half processing circuit 82a, the first last-half processing circuit 83a, the second first-half processing circuit 82b, the second last-half processing circuit 83b, and the clock buffer circuit group 84, which form the light reception unit 48, through the aluminum electrolytic capacitor group 85.

The first to fourth aluminum electrolytic capacitors 851 to 854, which form the aluminum electrolytic capacitor group 85, respectively supply power to various loads by reducing ripples of the direct current which is supplied from the power source connector 91.

Here, in the embodiment, operational voltages are different from each other in the CCD unit 60, the first first-half processing circuit 82a, the first last-half processing circuit 83a, the second first-half processing circuit 82b, the second last-half processing circuit 83b, and the clock buffer circuit group 84. For example, the CCD unit 60 operates at a first voltage V1, the first first-half processing circuit 82a and the first last-half processing circuit 83a operate at a second voltage V2, the second first-half processing circuit 82b and the second last-half processing circuit 83b operate at a third voltage V3, and the first to fifth clock buffer circuits 841 to 845 of the clock buffer circuit group 84 operate at a fourth voltage V4, respectively. Therefore, the four operational voltages are supplied to the power source connector 91, feeding circuits (wiring patterns) respectively corresponding to the four operational voltages are provided in the wiring substrate 81, and the first to fourth aluminum electrolytic capacitors 851 to 854 are respectively coupled to the respective feeding circuits one by one.

[Input Signal System For CCD Unit]

Figure 7:
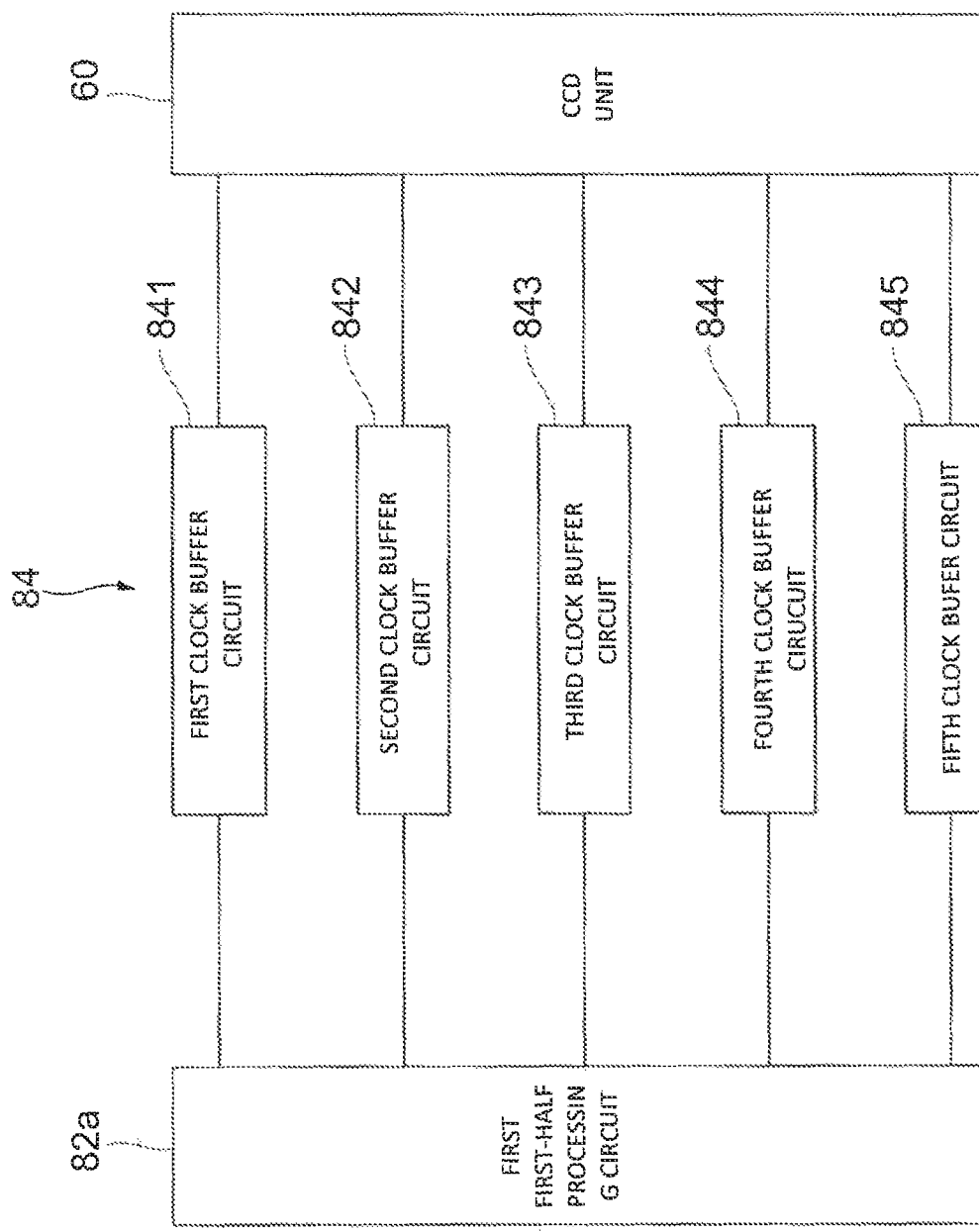
FIG. 7 is a view illustrating an input signal system for the CCD unit in the light reception unit.

FIG. 7 is a view illustrating an input signal system for the CCD unit 60 in the light reception unit 48.

The first first-half processing circuit 82a outputs control signals to the respective first to fifth clock buffer circuits 841 to 845 which form the clock buffer circuit group 84. In addition, the first to fifth clock buffer circuits 841 to 845, which form the clock buffer circuit group 84, output clock signals, which are used to drive the CCD unit 60, to the CCD unit 60. Meanwhile, instead of the first first-half processing circuit 82a, the first last-half processing circuit 83a may output the control signals to the clock buffer circuit group 84.

[Output Signal System From CCD Unit]

Figure 8:
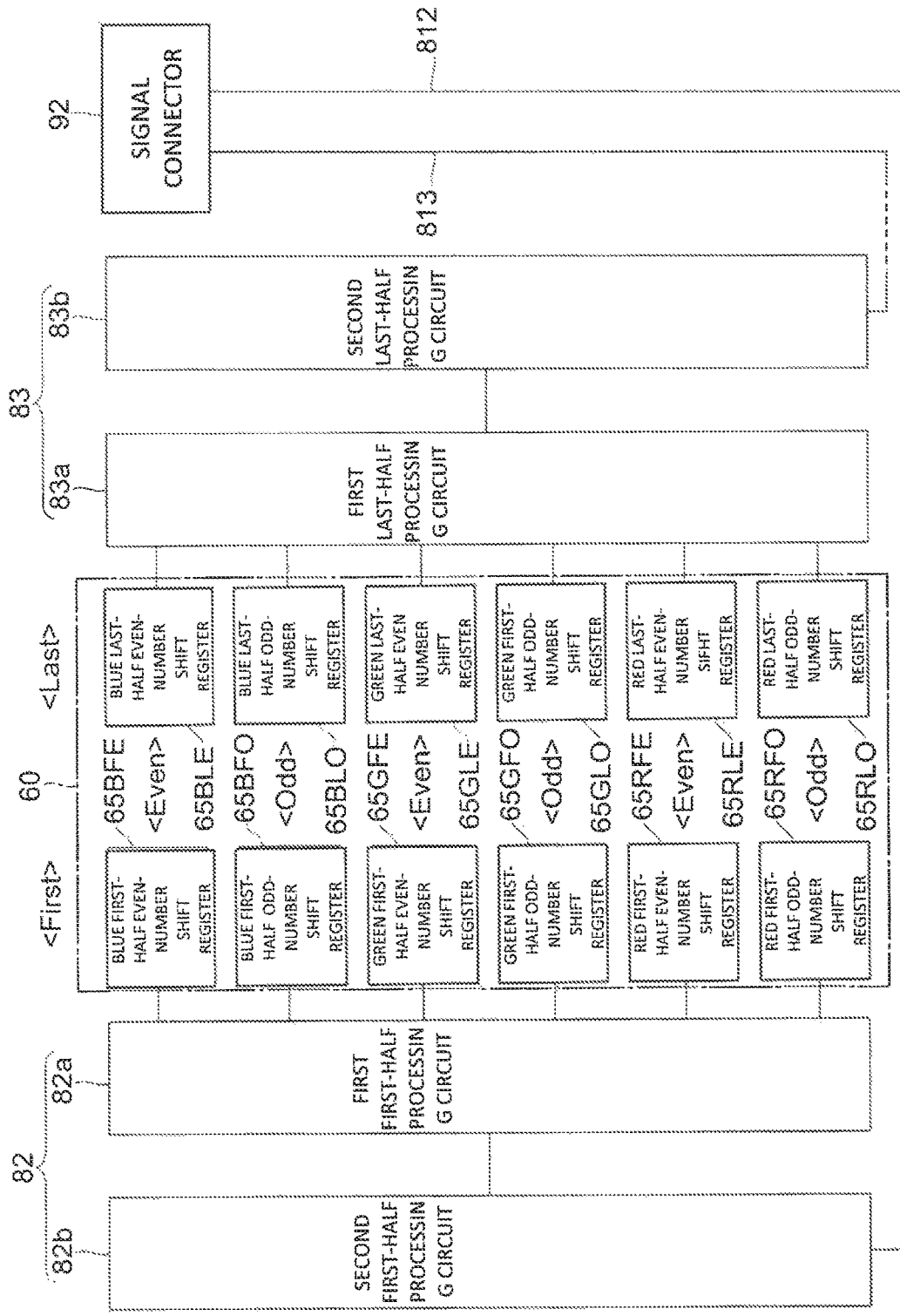
FIG. 8 is a view illustrating an output signal system from the CCD unit in the light reception unit.

FIG. 8 is a view illustrating an output signal system from the CCD unit 60 in the light reception unit 48.

The red first-half odd-number shift register 65RFO, the red first-half even-number shift register 65RFE, the green first-half odd-number shift register 65GFO, the green first-half even-number shift register 65GFE, the blue first-half odd-number shift register 65BFO, and the blue first-half even-number shift register 65BFE, which are provided in the CCD unit 60, are coupled to the first first-half processing circuit 82a. Furthermore, the first first-half processing circuit 82a and the second first-half processing circuit 82b are coupled to the signal connector 92 through a first-half side wiring 812.

In addition, the red last-half odd-number shift register 65RLO, the red last-half even-number shift register 65RLE, the green last-half odd-number shift register 65GLO, the green last-half even-number shift register 65GLE, the blue last-half odd-number shift register 65BLO, and the blue last-half even-number shift register 65BLE, which are provided in the CCD unit 60, are coupled to the first last-half processing circuit 83a. Furthermore, the first last-half processing circuit 83a and the second last-half processing circuit 83b are coupled to the signal connector 92 through a last-half side wiring 813.

In the embodiment, signal transmission between the second first-half processing circuit 82b and the signal connector 92 through the first-half side wiring 812 and signal transmission between the second last-half processing circuit 83b and the signal connector 92 through the last-half side wiring 813 are performed through the V-by-One. Therefore, a wiring length of the first-half side wiring 812 and a wiring length of the last-half side wiring 813 may have the same size.

[Conclusion]

In the embodiment, in the light reception unit 48 which includes the CCD unit 60 and the substrate unit 80, the first-half processing unit 82 of the substrate unit 80 is disposed on the outer side than one end of each of the red photoelectric conversion element row 61R, the green photoelectric conversion element row 61G, and the blue photoelectric conversion element row 61B of the CCD unit 60. In addition, in the embodiment, the last-half processing unit 83 of the substrate unit 80 is disposed on the outer side than the other end of each of the red photoelectric conversion element row 61R, the green photoelectric conversion element row 61G, and the blue photoelectric conversion element row 61B of the CCD unit 60. Therefore, compared to a case where the first-half processing unit 82 and the last-half processing unit 83 are disposed inside the one end and the other end, it is possible to distribute sources of heat (the red photoelectric conversion element row 61R, the green photoelectric conversion element row 61G, the blue photoelectric conversion element row 61B, the first-half processing unit 82, and the last-half processing unit 83 become sources of heat, respectively) in a case of feeding, and it is possible to suppress local temperature rise in the wiring substrate 81.

In addition, in the embodiment, the clock buffer circuit group 84 (the first to fifth clock buffer circuits 841 to 845), which supplies the clock signals to the red photoelectric conversion element row 61R, the green photoelectric conversion element row 61G, and the blue photoelectric conversion element row 61B of the CCD unit 60, is disposed to intersect (cross) with the red photoelectric conversion element row 61R or the like inside the one end and the other end. Therefore, compared to a case where the red photoelectric conversion element row 61R or the like and the clock buffer circuit group 84 are disposed in parallel, it is possible to distribute the sources of heat (the red photoelectric conversion element row 61R, the green photoelectric conversion element row 61G, the blue photoelectric conversion element row 61B, and the clock buffer circuit group 84 become sources of heat, respectively) in a case of feeding, and it is possible to suppress local temperature rise in the wiring substrate 81.

Here, in the embodiment, the clock buffer circuit group 84 is cooled using the ventilation fan 49. Therefore, compared to a case where the ventilation fan 49 is not provided, it is possible to further suppress local temperature rise, which occurs due to heat generated by the clock buffer circuit group 84, in the wiring substrate 81.

In addition, in the embodiment, in the wiring substrate 81 which forms the substrate unit 80, the first-half side frame ground 86F is provided between the one end and the first first-half processing circuit 82a of the first-half processing unit 82. In addition, the last-half side frame ground 86L is provided between the other end and the first last-half processing circuit 83a of the last-half processing unit 83. Therefore, compared to a case where the first-half side frame ground 86F and the last-half side frame ground 86L are not provided, it is possible to suppress local temperature rise at those parts in the wiring substrate 81.

Here, in the embodiment, the substrate unit 80, that is, the light reception unit 48 is attached to the metallic pedestal 50 using the first-half side frame ground 86F and the last-half side frame ground 86L. Therefore, heat, which is delivered from the various electrical elements to the wiring substrate 81, is discharged (radiated) to the outside from the first-half side frame ground 86F and the last-half side frame ground 86L through the pedestal 50, the device frame 41, and the like. Therefore, it is possible to further suppress temperature rise of the wiring substrate 81.

In addition, in the embodiment, the power source connector 91, which is used to supply power, and the signal connector, which is used to output a signal, are separately provided in the light reception unit 48 which includes the CCD unit 60 and the substrate unit 80. Therefore, compared to a case where power is supplied and a signal is output through one connector, it is possible to suppress noise superimposing on a signal due to the power source.

Specifically, in the embodiment, the power source connector 91 is disposed on the outer side than the one end and the signal connector 92 is disposed on the outer side than the other end. Therefore, compared to a case where the power source connector 91 and the signal connector 92 are disposed to be close, it is possible to further suppress noise superimposing on a signal.

In addition, in the embodiment, the aluminum electrolytic capacitor group 85, which is used to cause the ripples of the voltage to be smooth, is collectively disposed on an outer side than one end, that is, on a side in which the power source connector 91 is provided. Therefore, compared to a case where the aluminum electrolytic capacitor group 85 is disposed on the outer side than the other end, that is, on a side to which the signal connector 92 is provided, it is possible to further suppress noise superimposing on a signal.

[Others]

Meanwhile, in the embodiment, a case where the CCD unit 60 includes three photoelectric conversion element rows (the red photoelectric conversion element row 61R, the green photoelectric conversion element row 61G, and the blue photoelectric conversion element row 61B) is described as an example. However, the present invention is not limited thereto, and the CCD unit 60 may include at least one photoelectric conversion element row.

In addition, in the embodiment, the CCD image sensor is used as the photoelectric conversion element row. However, the present invention is not limited thereto, and, for example, a Complementary MOS (CMOS) image sensor may be used.

What is claimed is:

1. A photoelectric conversion device comprising:
   a substrate;
   a photoelectric conversion element row including a plurality of photoelectric conversion elements arranged in a longitudinal direction of the substrate, the plurality of photoelectric conversion elements being arranged from a first end to a second end, the photoelectric conversion element row being attached to the substrate;
   a power source connector attached to a first part of the substrate that is on a first end side of the substrate in the longitudinal direction, the power source connector being configured to connect a power cable configured to supply power to the photoelectric conversion element row;
   a signal connector attached to a second part of the substrate that is on a second end side of the substrate in the longitudinal direction, the signal connector being configured to connect a signal cable configured to output a signal from the photoelectric conversion element row;
   a first processing circuit attached to the substrate on an outer side in the longitudinal direction as compared to the first end of the photoelectric conversion element row, the first processing circuit being configured to perform a process on output signals output from a first set of photoelectric conversion elements of the plurality of photoelectric conversion elements that are disposed on the first end, which is proximal to the power source connector, in the photoelectric conversion element row;
   a second processing circuit that is attached to the substrate on an outer side in the longitudinal direction as compared to the second end of the photoelectric conversion element row, the second processing circuit being configured to perform a process on output signals output from a second set of photoelectric conversion elements of the plurality of photoelectric conversion elements that are disposed on the second end, which is proximal to the signal connector, in the photoelectric conversion element row; and a row of output circuits attached to the substrate such that the row of the output circuits intersects with the photoelectric conversion elements row between the first end and the second end of the photoelectric conversion element row, the output circuits being configured to output a control signal to the photoelectric conversion element row.

2. The photoelectric conversion device according to claim 1, wherein the substrate is provided with a first through hole penetrating the substrate between the first end of the photoelectric conversion element row and the first processing circuit, and a second through hole penetrating the substrate between the second end of the photoelectric conversion element row and the second processing circuit.

3. The photoelectric conversion device according to claim 2, wherein a part of a wiring pattern is exposed on a peripheral edge of the first through hole and the second through hole which are provided in the substrate.

4. An image reading device comprising:
the photoelectric conversion device according to claim 2; and
a support member that supports the photoelectric conversion device,
wherein the support member supports the photoelectric conversion device using the first through hole and the second through hole.

5. An image reading device comprising:
a light source configured to irradiate a document with light;
a lens configured to condense reflected light from the document; and
the photoelectric conversion device according to claim 1, the photoelectric conversion device being configured to perform photoelectric conversion on the light condensed by the lens.

6. The image reading device according to claim 5, further comprising:
a ventilation device configured to send air toward a surface on a side, to which the photoelectric conversion element row is not attached, of the substrate of the photoelectric conversion device.

7. The photo electric conversion device according to claim 1, further comprising:
a plurality of aluminum electrolytic capacitors configured to smooth a supplied direct current and output the smoothed direct current to the photoelectric conversion element row, wherein:
the aluminum electrolytic capacitors are attached to the substrate only on the outer side as compared to the first end of the photoelectric conversion element row in the longitudinal direction, and
the aluminum electrolytic capacitors are not attached on the outer side as compared to the second end of the photoelectric conversion element row in the longitudinal direction.

8. An image reading device comprising:
a photoelectric conversion device including:
a substrate;
a photoelectric conversion element row that includes a plurality of photoelectric conversion elements arranged in a longitudinal direction of the substrate, the plurality of photoelectric conversion elements being arranged from a first end to a second end, the photoelectric conversion element row being attached to the substrate;
a power source connector that is attached to a first part of the substrate that is on a first end side of the substrate in the longitudinal direction, the power source connector being configured to connect a power cable used for supplying power to the photoelectric conversion element row; and
a signal connector that is connected to a second part of the substrate that is on a second end side of the substrate in the longitudinal direction, the signal connector being configured to connect a signal cable used for outputting a signal from the photoelectric conversion element row;
a power source unit configured to supply power to the photoelectric conversion device via the power cable and the power source connector;
a signal processing unit configured to perform a process on the signal received from the photoelectric conversion device via the signal cable and the signal connector;
a first processing circuit attached to the substrate on an outer side in the longitudinal direction as compared to the first end of the photoelectric conversion element row, the first processing circuit being configured to perform a process on output signals output from a first set of photoelectric conversion elements of the plurality of photoelectric conversion elements that are disposed on the first end, which is proximal to the power source connector, in the photoelectric conversion element row;
a second processing circuit attached to the substrate on an outer side in the longitudinal direction as compared to the second end of the photoelectric conversion element row, the second processing circuit being configured to perform a process on output signals output from a second set of photoelectric conversion elements of the plurality of photoelectric conversion elements that are disposed on the second end, which is proximal to the signal connector, in the photoelectric conversion element row; and
a row of output circuits attached to the substrate such that the row of the output circuits intersects with the photoelectric conversion element row between the first end and the second end of the photoelectric conversion element row, the output circuits being configured to output a control signal to the photoelectric conversion element row.

* * * * *